(12) United States Patent
Lin et al.

(10) Patent No.: US 7,721,439 B2
(45) Date of Patent: May 25, 2010

(54) MANUFACTURING SYSTEM FOR MAKING A HEAT DISSIPATING DEVICE

(75) Inventors: Jao-Ching Lin, Hsin-Chuang (TW); Pei-Pei Ding, Hsin-Chuang (TW); Hsiu-Wei Yang, Hsin-Chuang (TW); Wen-Hwa Yu, Hsin-Chuang (TW); Yen-Wen Chen, Hsin-Chuang (TW)

(73) Assignee: Asia Vital Components Co., Ltd. (TW)

( * ) Notice: Subject to any disclaimer, the term of this patent is extended or adjusted under 35 U.S.C. 154(b) by 1300 days.

(21) Appl. No.: 11/219,562

(22) Filed: Sep. 2, 2005

(65) Prior Publication Data
US 2006/0213056 A1   Sep. 28, 2006

(30) Foreign Application Priority Data
Mar. 28, 2005   (TW) ............................... 94109621 A (51) Int. Cl.
*B23P 15/26* (2006.01)
*B21D 39/06* (2006.01)
*B21D 53/00* (2006.01)

(52) U.S. Cl. ........................... 29/890.039; 29/890.032; 29/890.035; 29/726; 165/104.26

(58) Field of Classification Search .................. 29/726, 29/727, 890.03, 890.032, 890.035, 890.039; 165/104.26
See application file for complete search history.

(56) References Cited

U.S. PATENT DOCUMENTS

| 7,464,463 | B2 * | 12/2008 | Lin et al. | 29/890.032 |
| 2004/0188068 | A1 * | 9/2004 | Luo et al. | 165/104.26 |
| 2006/0283578 | A1 * | 12/2006 | Hsu | 165/104.26 |

* cited by examiner

*Primary Examiner*—David P Bryant
*Assistant Examiner*—Christopher M Koehler
(74) *Attorney, Agent, or Firm*—Ostrolenk Faber LLP (57) ABSTRACT

A manufacturing system for processing a container body into a heat dissipating device includes: a support for supporting the container body thereon; an elastically deformable member covering a periphery of an opening in an upper wall of the container body and defining a cavity in fluid communication with interior of the container body through the opening; a vacuuming device connected to the elastically deformable member for vacuuming the inner space; a working fluid-loading device connected to the elastically deformable member for filling a predetermined amount of the working fluid into the container body; a depressing device including opposite upper and lower pressing members; and a driving mechanism for driving movement of at least one of the upper and lower pressing members.

11 Claims, 9 Drawing Sheets

MANUFACTURING SYSTEM FOR MAKING A HEAT DISSIPATING DEVICE

CROSS-REFERENCE TO RELATED APPLICATION

This application claims priority of Taiwanese application no. 094109621, filed on Mar. 28, 2005.

BACKGROUND OF THE INVENTION

1. Field of the Invention

This invention relates to manufacturing system for making a heat dissipating device, more particularly to a manufacturing system for making a heat dissipating device including a container body with a wick structure and a working fluid therein.

2. Description of the Related Art

Figure 1:
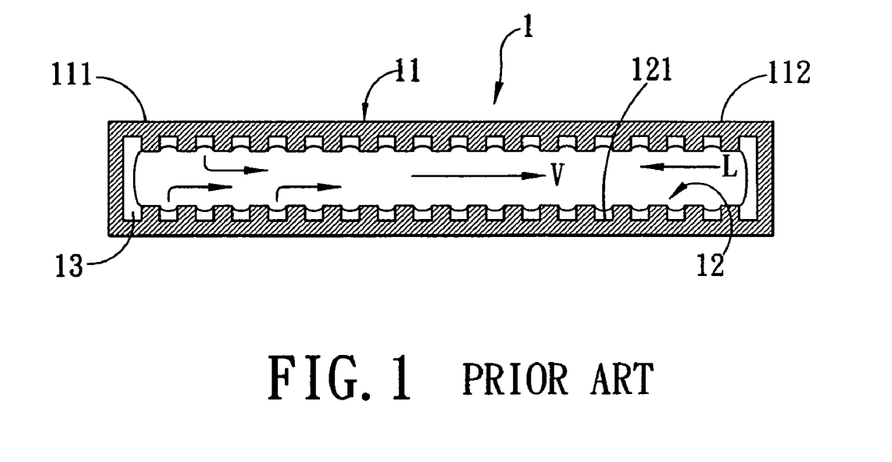
FIG. 1 is a sectional view of a conventional heat dissipating device.

FIG. 1 illustrates a conventional heat dissipating device, which is a flat plate-type heat pipe, useful for dissipating heat resulting from operation of an electronic component, such as a CPU, attached thereto. The heat dissipating device includes a container 1 with a container body 11 made from a metal and having heating and cooling ends 111, 112, a wick structure 12 formed in the container body 11, and a working fluid 13 filled in the container body 11. The wick structure 12 is formed with a network of capillaries 121. In use, the working fluid 13 at the heating end 111 is vaporized upon absorbing heat from the electronic component. The vapor thus formed flows from the heating end 111 toward the cooling end 112, and is subsequently condensed thereat, which, in turn, results in a liquid flow from the cooling end 112 toward the heating end 111 by virtue of the capillary mechanism of the capillaries 121 of the wick structure 12, thereby enabling automatic circulation of the working fluid 13 in the container body 11.

Since the liquid-vapor balance of the working fluid 13 in the container body 11 is critical to efficient heat dissipation, it is required that there be substantially no presence of air in the container body 11.

Figure 2:
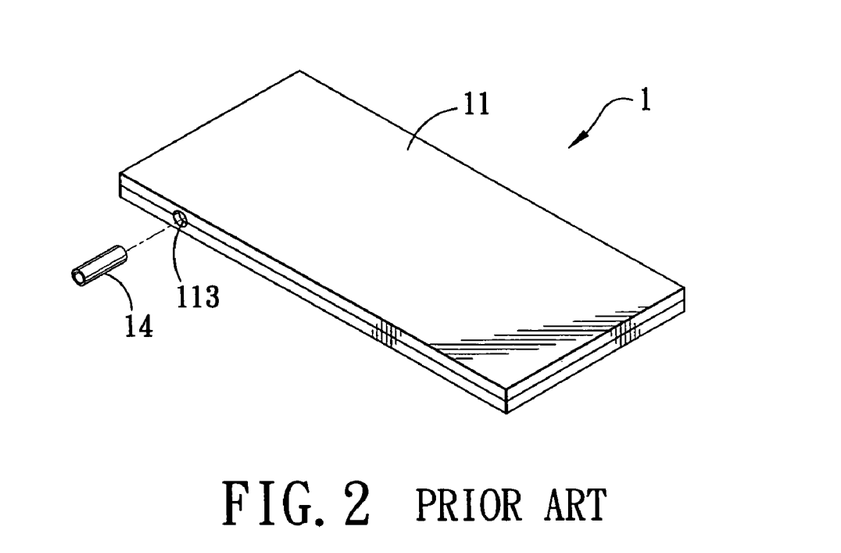
FIGS. 2 to 4 illustrate consecutive steps to illustrate how the conventional heat dissipating device of FIG. 1 is made.
Figure 3:
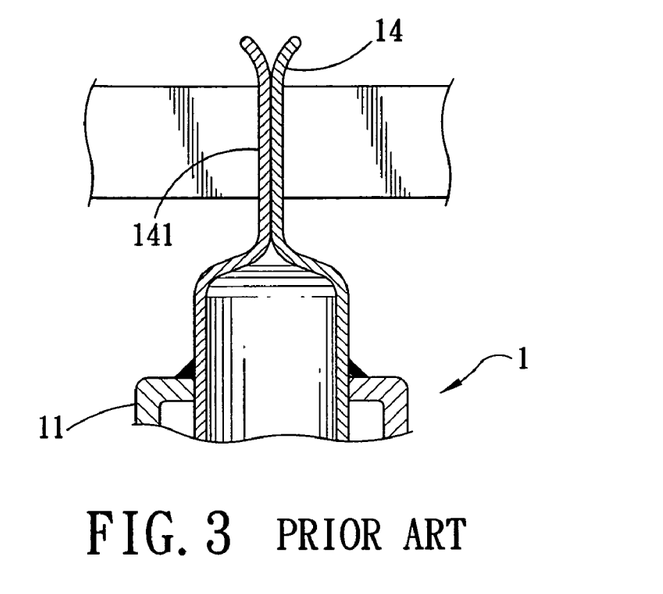
Figure 4:
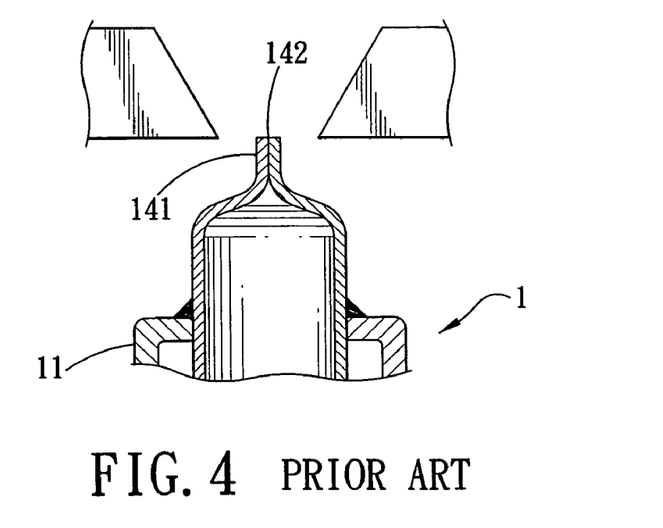

FIGS. 2 to 4 illustrate a conventional method for making the heat dissipating device. The method includes the steps of inserting a tube 14 into an opening 113 in the container body 11, sealing a clearance around the tube 14 by welding techniques, vacuuming the container body 11 through the tube 14, filling the container body 11 with the working fluid 13 through the tube 14, deforming the tube 14 to form a closure 141 so as to provide a temporary sealing for preventing air from entering into the container body 11, and immediately cutting the tube 14 such that the closure 141 remains on the container body 11 and then sealing an outer end 142 of the closure 141 with a sealing material.

Since the temporary sealing effect provided by the closure 141 thus formed is poor, air may enter into the container body 11 through slits formed in the closure 141 prior to the sealing operation of the closure 141, thereby adversely affecting the vapor-liquid balance of the working fluid 13 in the container body 11. As a consequence, the sealing operation is required to be conducted at the same apparatus where the deforming and sealing operations are performed, which considerably increases the cost of the apparatus.

SUMMARY OF THE INVENTION

The object of the present invention is to provide a manufacturing system for making a heat dissipating device that is capable of overcoming the aforesaid drawbacks of the prior art.

According to the present invention, there is provided a manufacturing system for processing a container body into a heat dissipating device. The container body defines an inner space therein, includes opposite flat upper and lower walls, and is provided with a wick structure that is disposed between the upper and lower walls. The upper wall is formed with an opening in fluid communication with the inner space. The manufacturing system comprises: a support adapted to support the container body thereon; an elastically deformable member that is adapted to cover a periphery of the opening in the upper wall of the container body and that defines a cavity in fluid communication with the inner space through the opening; a vacuuming device connected to the elastically deformable member and adapted to vacuum the inner space by withdrawing air from the inner space through the cavity and the opening; a working fluid-loading device connected to the elastically deformable member and adapted to fill a predetermined amount of the working fluid into the container body through the cavity and the opening; a depressing device including opposite upper and lower pressing members that are adapted to abut respectively against the upper and lower walls of the container body; and a driving mechanism connected to the upper and lower pressing members for driving movement of at least one of the upper and lower pressing members to depress a respective one of the upper and lower walls.

BRIEF DESCRIPTION OF THE DRAWINGS

Other features and advantages of the present invention will become apparent in the following detailed description of the preferred embodiment of the invention, with reference to the accompanying drawings, in which.

DETAILED DESCRIPTION OF THE PREFERRED EMBODIMENT

Before the present invention is described in greater detail, it should be noted that same reference numerals have been used to denote like elements throughout the specification.

Figure 5:
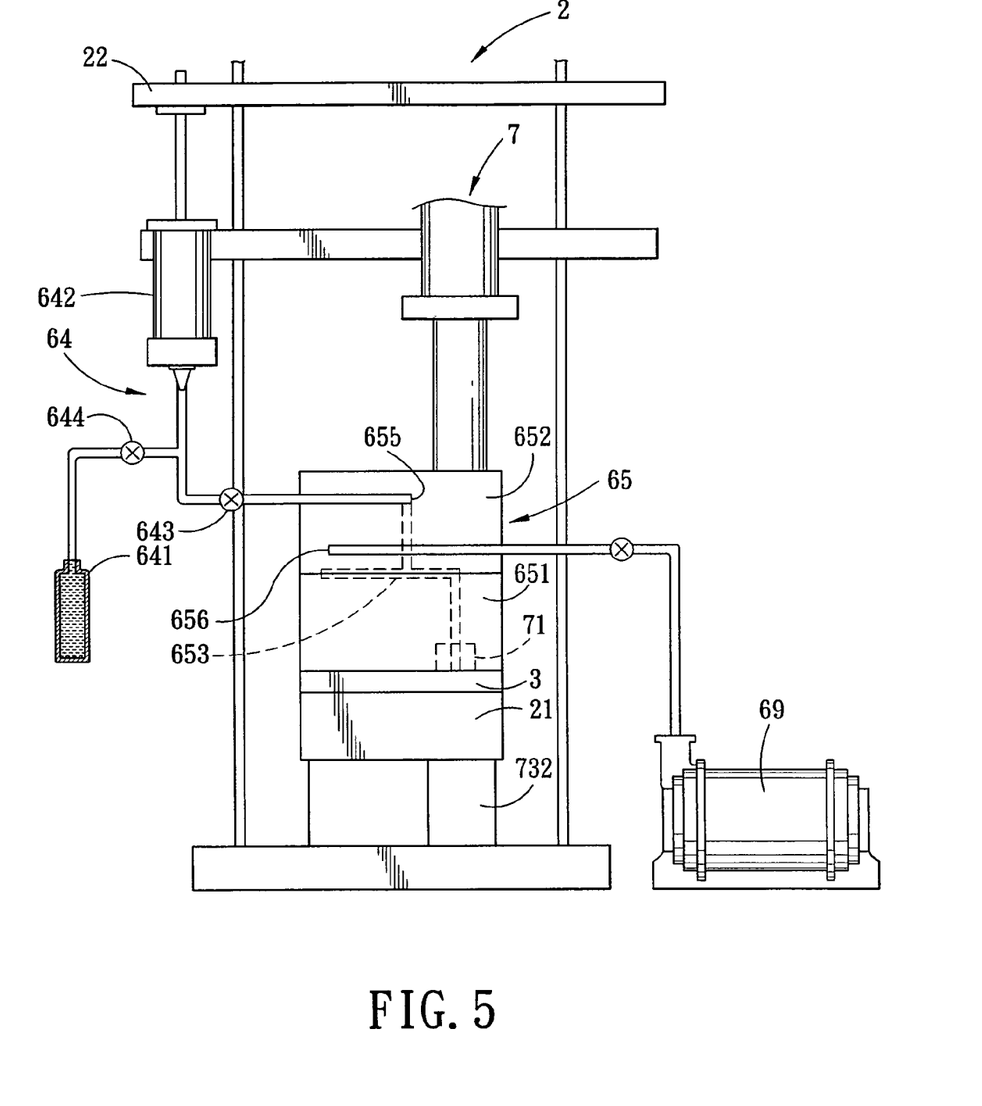
FIG. 5 is a schematic view of the preferred embodiment of a manufacturing system for making a heat dissipating device according to this invention.

FIG. 5 illustrates the preferred embodiment of a manufacturing system for making a flat plate-type heat dissipating device according to the present invention. The heat dissipating device is useful for dissipating heat resulting from operation of electronic components, such as a CPU.

Figure 12:
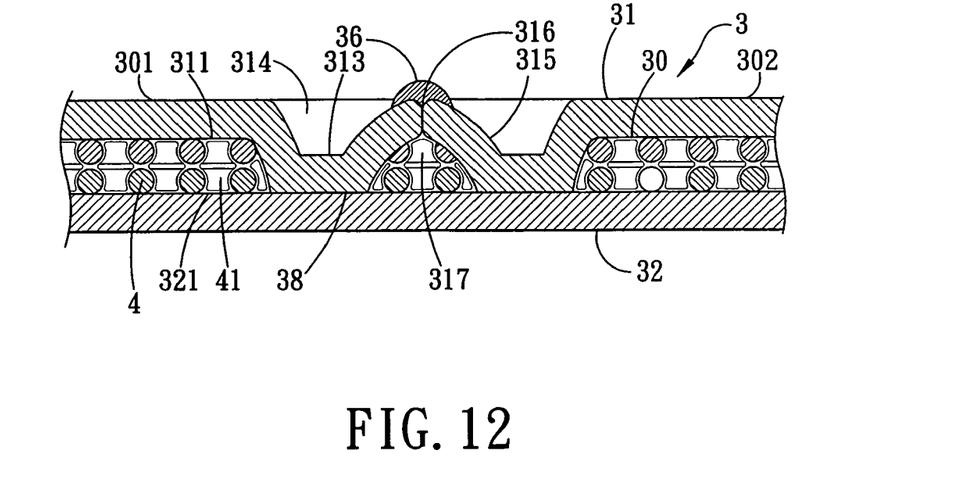
FIG. 12 is a fragmentary sectional view of the heat dissipating device formed using the manufacturing system of the preferred embodiment.

Referring to FIG. 12, the heat dissipating device thus formed includes: a container body 3 defining an inner space 30 therein, and having opposite heating and cooling ends 301, 302, a fluid passage 316 disposed between the heating and cooling ends 301, 302, and opposite flat upper and lower walls 31, 32 extending from the heating end 301 to the cooling end 302, each of the upper and lower walls 31, 32 having an inner surface 311, 321; a working fluid received in the inner space 30 in the container body 3; a wick structure 4 mounted in the inner space 30 in the container body 3 and extending from the heating end 301 to the cooling end 302 to permit liquid flow from the cooling end 301 to the heating end 302 of the container body 3 by virtue of capillary mechanism when a vapor flow resulting from heating of the working fluid at the heating end 301 flows to the cooling end 302 of the container body 3; and a sealing material 36 that seals the fluid passage 316. One of the upper and lower walls 31, 32, i.e., the upper wall 31, has a wall portion 313 that is disposed adjacent to the fluid passage 316 and that is depressed to form a first depression 314 indented inwardly of the inner space 30 in such a manner that the depressed wall portion 313 of said one of the upper and lower walls 31, 32 cooperates with the other of the upper and lower walls 31, 32 to form a sealing mechanism 38 that functions to isolate the fluid passage 316 from the inner space 30. The upper wall 31 is further formed with a bulging wall portion 315 that is surrounded by the depressed wall portion 313 and that protrudes into the first depression 314. The fluid passage 316 is formed in the bulging wall portion 315, and is deformed into a slit, which is sealed by the sealing material 36, after the depression operation of the upper wall 31. The bulging wall portion 315 of the upper wall 31 cooperates with the lower wall 32 to define a cavity 317 therebetween. The first depression 314 is looped in shape, and is preferably annular in shape. Each of the upper and lower walls 31, 32 is in the form of a flat plate.

The container body 3 is preferably made from a metal selected from the group consisting of copper and aluminum. Before being processed into the heat dissipating device, the upper wall 31 of the container body 3 is formed with an opening 318 (see FIG. 9) that is formed into the fluid passage 316 after processing the container body 3.

Figure 6:
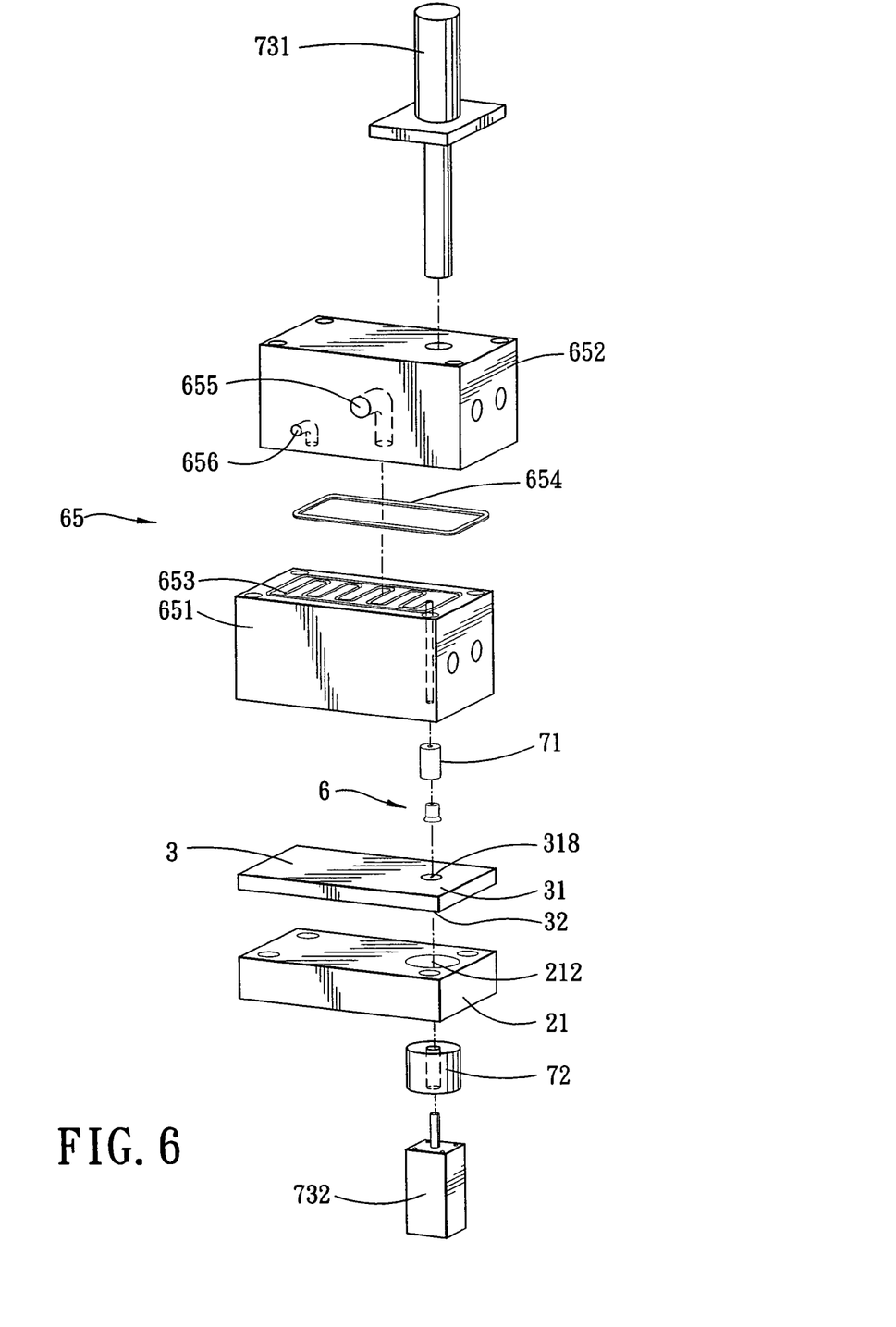
FIG. 6 is an exploded perspective view of a heating mechanism, a driving mechanism, a depressing device, a support, and an elastically deformable member of the manufacturing system of the preferred embodiment.

Referring to FIGS. 5 to 8, the manufacturing system includes: a supporting unit 2 with a rack 22 and a support 21 adapted to support the container body 3 thereon (see FIG. 5); an elastically deformable member 6 that is adapted to cover a periphery of the opening 318 in the upper wall 31 of the container body 3 (see FIG. 9) and that defines a cavity 63 in fluid communication with the inner space 30 through the opening 318; a vacuuming device 69, such as a vacuum pump, connected to the elastically deformable member 6 and adapted to vacuum the inner space 30 by withdrawing air from the inner space 30 through the cavity 63 and the opening 318 (see FIGS. 5 and 9); a working fluid-loading device 64 mounted on the rack 22, connected to the elastically deformable member 6, and adapted to fill a predetermined amount of the working fluid into the container body 3 through the cavity 63 and the opening 318 (see FIGS. 5 and 10); a depressing device 7 including opposite upper and lower pressing members 71, 72 that are adapted to abut respectively against the upper and lower walls 31, 32 of the container body 3 (see FIG. 9); and a driving mechanism (731, 732) connected to the upper and lower pressing members 71, 72 for driving movement of at least one of the upper and lower pressing members 71, 72 to depress a respective one of the upper and lower walls 31, 32 (see FIGS. 5 and 6).

In this embodiment, the elastically deformable member 6 is preferably made from a material selected from silicone and rubbers, such as nitrile-butadiene rubber, and has a funnel-shaped part 61 that is adapted to be attached to the container body 3 for covering the opening 318, and a hollow connecting part 62 that extends from the funnel-shaped part 61 and that is connected to the vacuuming device 69 through the upper pressing member 71 and a heating mechanism 65 (see FIG. 5), which will be described in greater detail in the following paragraphs.

Figure 7:
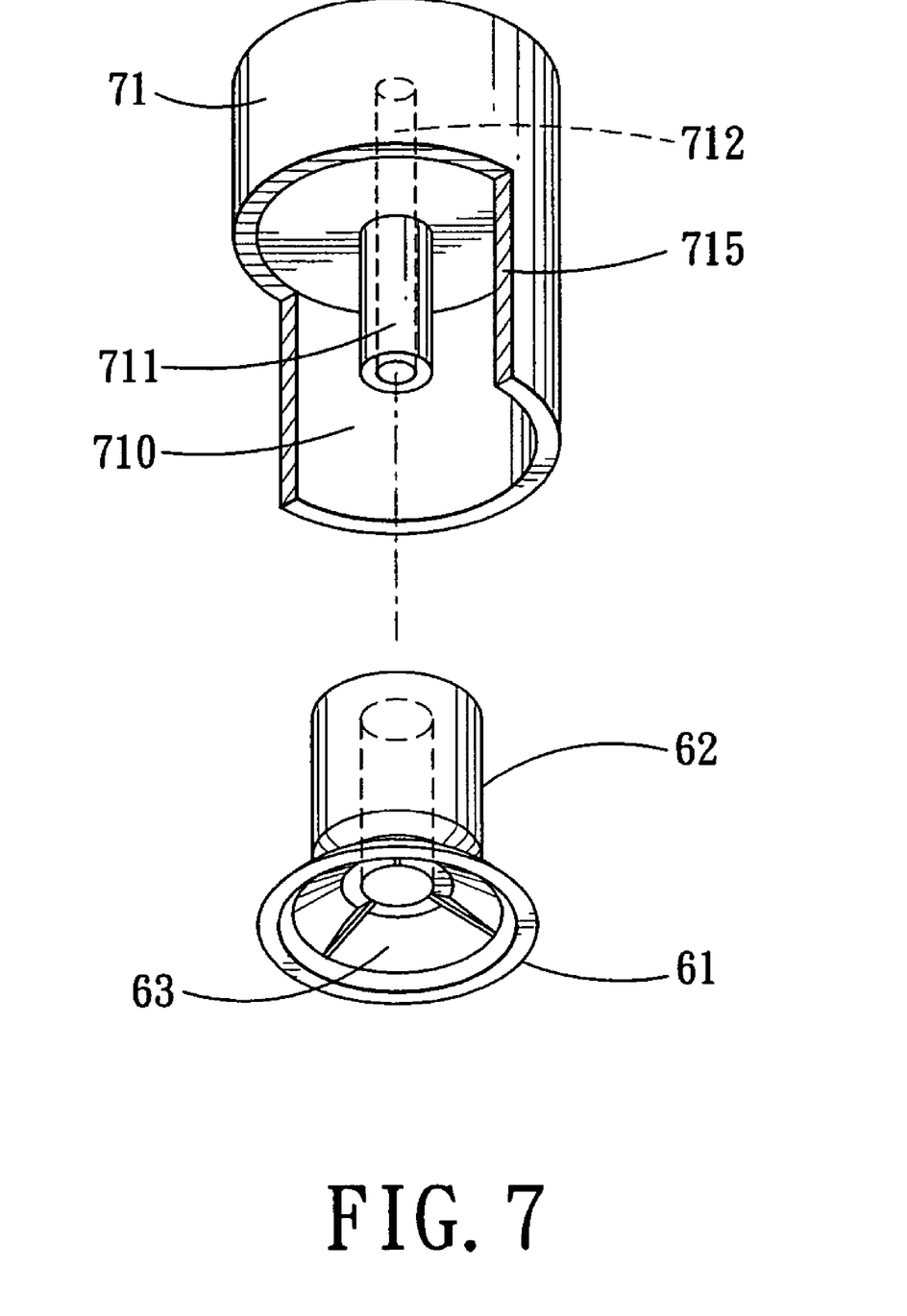
FIG. 7 is a partly cutaway, exploded perspective view of an upper pressing member of the depressing device and the elastically deformable member of the manufacturing system of the preferred embodiment.
Figure 9:
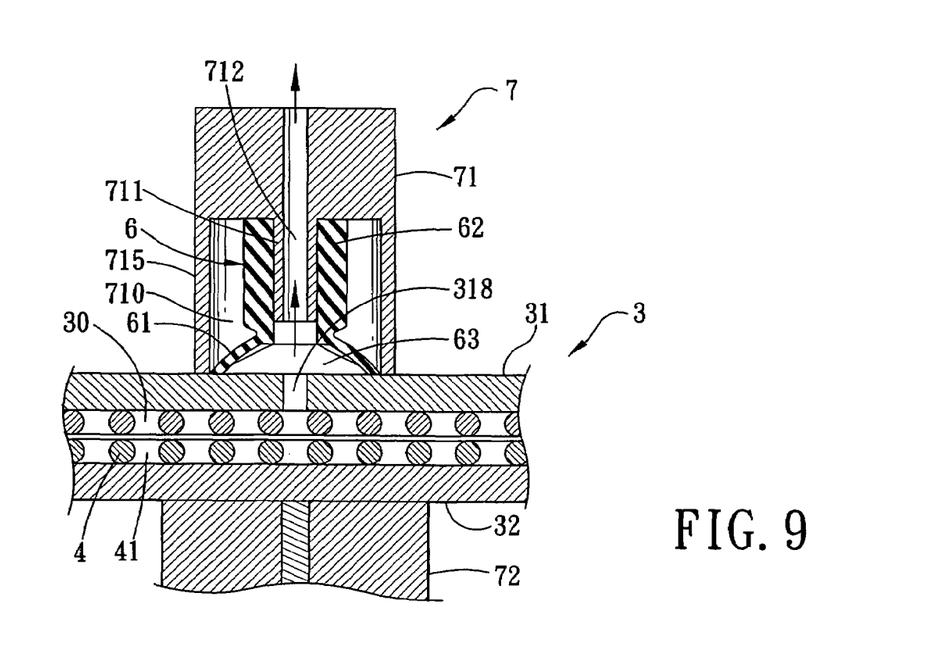
FIGS. 9 to 11 are fragmentary sectional views to illustrate how an assembly of the elastically deformable member and the depressing device of the manufacturing system of the preferred embodiment is operated to form a sealing mechanism in the container body of the heat dissipating device.
Figure 10:
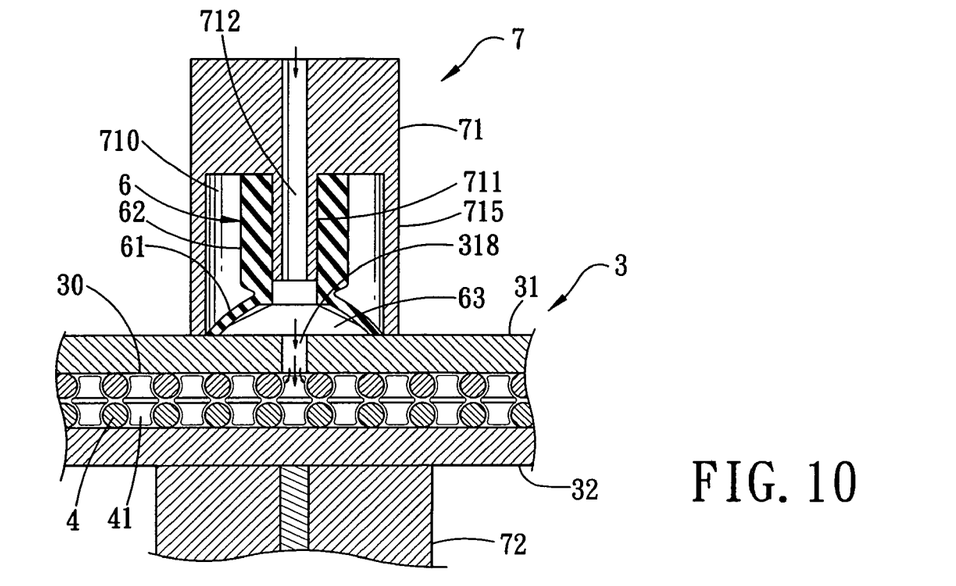

Referring to FIGS. 6, 7, and 9, the upper pressing member 71 has an annular outer part 715 that is adapted to abut against the upper wall 31 of the container body 3 and that defines an accommodating space 710 therein, and an inner tube 711 that is surrounded by the annular outer part 715 and that defines a fluid channel 712 therein for fluid communication with the cavity 63. The elastically deformable member 6 is mounted in the accommodating space 714 in such a manner that the connecting part 62 is securely sleeved on the inner tube 711 and that the funnel-shaped part 61 diverges downwardly from the inner tube 711 to cover the periphery of the opening 318 in the container body 3.

Referring to FIG. 6, the lower pressing member 72 is in the form of a cylindrical body that is registered with the upper pressing member 71 in a vertical direction transverse to the support 21. The support 21 is formed with a through-hole 212. The lower pressing member 72 extends through the through-hole 212 so as to abut against the lower wall 32.

The driving mechanism includes upper and lower plungers 731, 732 for driving independently movements of the upper and lower pressing members 71, 72, respectively.

The heating mechanism 65 is mounted on the support 21, is formed with a tortous heating channel 653 connected to the working fluid-loading device 64 and the inner tube 711 of the upper pressing member 71, and is operable to provide heat to the heating channel 653 so as to vaporize the working fluid in the heating channel 653 during loading of the working fluid into the inner space 30 in the container body 3. The heating mechanism 65 can prevent undesired trapping of the working fluid in a fluid discharging path including the fluid channel 712 and the periphery of the opening 318 during discharging of the working fluid from the working fluid-loading device 64 into the container body 3, and enable the whole predetermined amount of the working fluid to be delivered into the inner space 30.

The heating mechanism 65 is further formed with a vacuum-connecting channel 656 that is connected to the vacuuming device 69 and the heating channel 653, and a fluid-connecting channel 655 that is connected to the working fluid-loading device 64 and the heating channel 653. The heating mechanism 65 includes thermally conductive first and second casing halves 651, 652 that cooperatively define the heating channel 653 therebetween. A sealing pad 654 is sealingly sandwiched between the first and second casing halves 651, 652.

Figure 8:
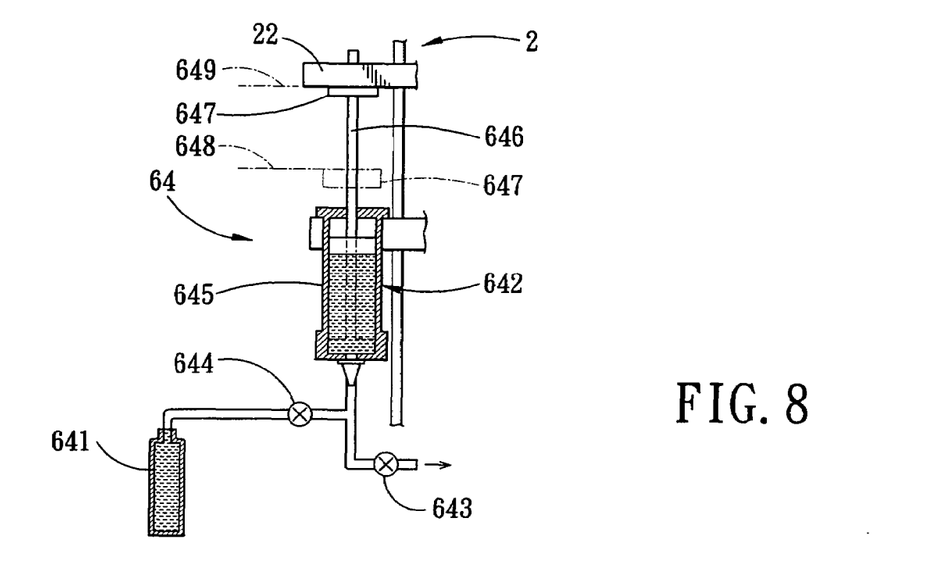
FIG. 8 is a schematic view to illustrate how a working fluid-loading device of the manufacturing system of the preferred embodiment functions to load a working fluid into a container body of the heat dissipating device.

Referring to FIGS. 5 and 8, in combination with FIG. 6, the working fluid-loading device 64 includes a fluid storage container 641 adapted to store the working fluid therein, and a piston-and-cylinder assembly 642 disposed downstream of the fluid storage container 641 and having a cylinder 645 and a piston 646 that extends into the cylinder 645 and that is movable relative to the cylinder 645 so as to draw the predetermined amount of the working fluid from the fluid storage container 641 into the cylinder 645 and so as to deliver the predetermined amount of the working fluid into the heating channel 653 through the fluid connecting channel 655.

The working fluid-loading device 64 further includes a first control valve 644 disposed between and connected to the fluid storage container 641 and the piston-and-cylinder assembly 642, a second control valve 643 disposed between and connected to the piston-and-cylinder assembly 642 and the fluid connecting channel 655, and a sensor 647 mounted on the piston 646 for detecting the position of the piston 646 relative to the cylinder 645 so as to control the amount of the working fluid transferred from the fluid storage container 641 into the cylinder 645. The sensor 647 can be preset such that signals are generated when the piston 646 reaches preset positions so as to control opening and closing of the first and second control valves 644, 643 during loading of the working fluid into the container body 3.

During processing of the container body 30 into the heat dissipating device, the vacuuming device 69 is actuated to draw air from the inner space 30 through the opening 318, the cavity 63, the fluid channel 712 (see FIG. 9), the heating channel 653, and the vacuum-connecting channel 656 (see FIG. 5). After the inner space 30 is vacuumed, the first and second casing halves 651, 652 of the heating mechanism 65 are heated to a desired temperature that is sufficient to vaporize the working fluid to be loaded inside the heating channel 653.

To load the predetermined amount of the working fluid into the heating channel 653, the sensor 647 is preset such that first and second signals are generated when the sensor 647 is disposed at first and second positions 648, 649, respectively (see FIG. 8). Before loading the working fluid to the heating channel 653, the piston 646 is initially disposed at a lower position corresponding to the first position 648 of the sensor 647, and the first control valve 644 is opened, while the second control valve 643 is closed. The piston 646 is then moved to an upper position corresponding to the second position 649 of the sensor 647 using a hydraulic driving source or a pneumatic driving source (not shown) so as to draw the predetermined amount of the working fluid from the fluid storage container 641 into the cylinder 645. When the sensor 647 reaches the second position 649, the second signal is generated to stop driving of the piston 646, and the first control valve 644 is closed thereafter. The second control valve 643 is then opened, and the piston 646 is moved from the second position 649 toward the first position 648 so as to ensure the whole amount of the working fluid in the cylinder 645 can be delivered into the heating channel 653. As soon as the working fluid passes through the heating channel 653, the working fluid is vaporized and is suctioned into the inner space 30 by virtue of the vacuum condition in the inner space 30 (see FIG. 10). When the sensor 647 reaches the first position 648, the first signal is generated to stop driving of the piston 646 and to close the second control valve 643. Since the inner space 30 is in a vacuum state, the working fluid can be automatically suctioned into the inner space 30 from the cylinder 645 through the heating channel 653. It is noted that simultaneous movement of the piston 646 from the upper position to the lower position during suction of the vaporized working fluid into the container body 3 can prevent formation of bubbles, which can have an adverse effect on the loaded amount of the working fluid into the inner space 30, in the cylinder 645.

After the predetermined amount of the working fluid is loaded into the inner space 30, the upper wall 31 is depressed by the upper pressing member 71 (see FIG. 11) driven by the upper plunger 731 (see FIG. 6) so as to form the sealing mechanism 38 at the juncture between the periphery of the opening 318 and the lower wall 32. The opening 318 is now deformed into a slit that defines the fluid passage 316 which is subsequently sealed by the sealing material 36 using welding techniques or using an adhesive, such as epoxy resin, silicone, or UV adhesive.

Figure 11:
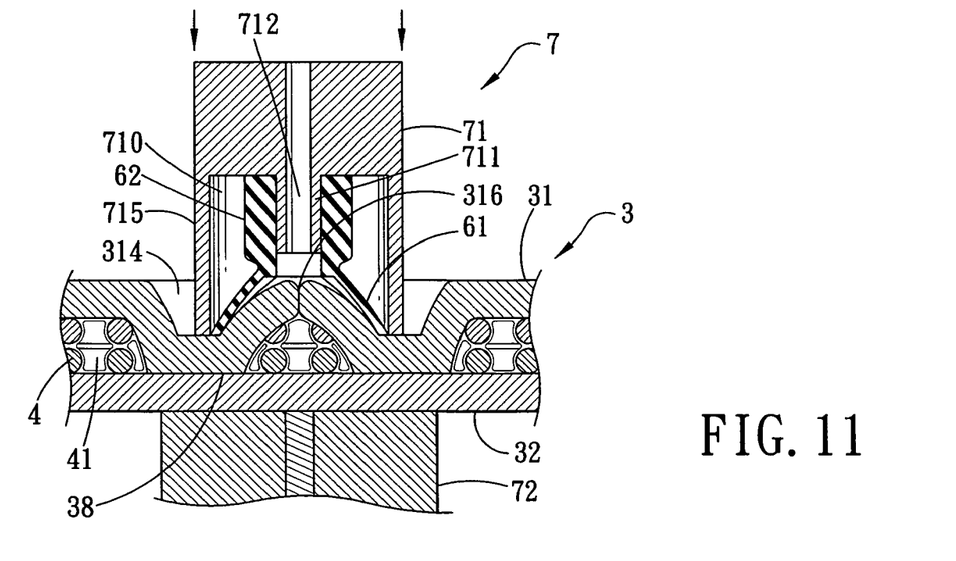
Figure 13:
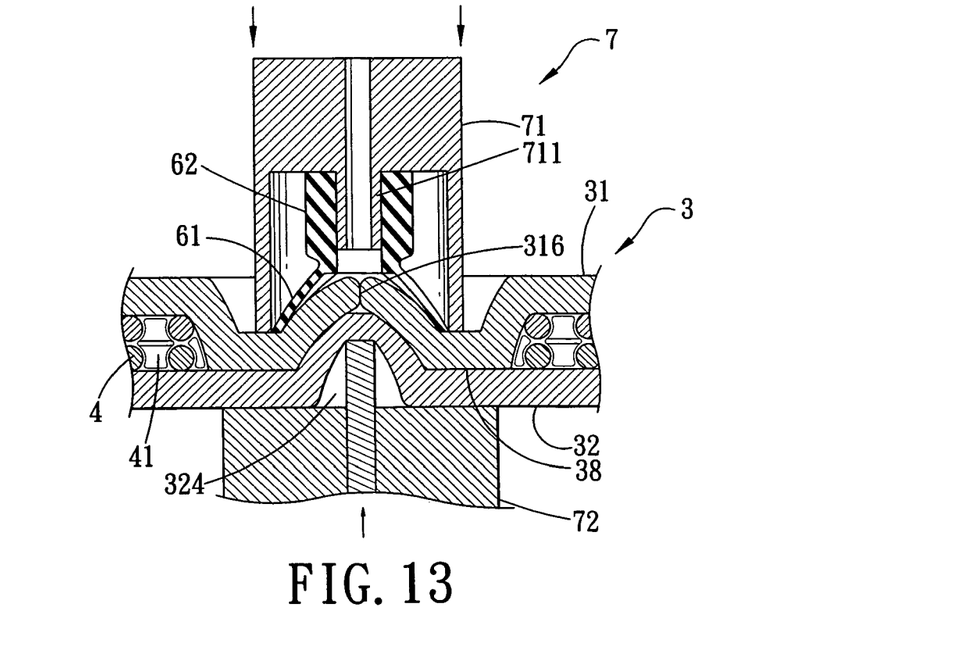
FIG. 13 is a fragmentary sectional view to illustrate how the assembly of the elastically deformable member and the depressing device of the manufacturing system of the preferred embodiment is operated to form a sealing mechanism having a structure different from that shown in FIG. 11.

FIG. 13 illustrates how the heat dissipating device is formed with another sealing mechanism 38 having a structure different from that of the sealing mechanism 38 of the heat dissipating device of FIGS. 11 and 12. The sealing mechanism 38 is formed by further depressing the lower wall 32 toward the upper wall 31 through driving of the lower pressing member 72 by the lower plunger 732 (see FIG. 6) so as to form a second depression 324 in the lower wall 32.

Figure 14:
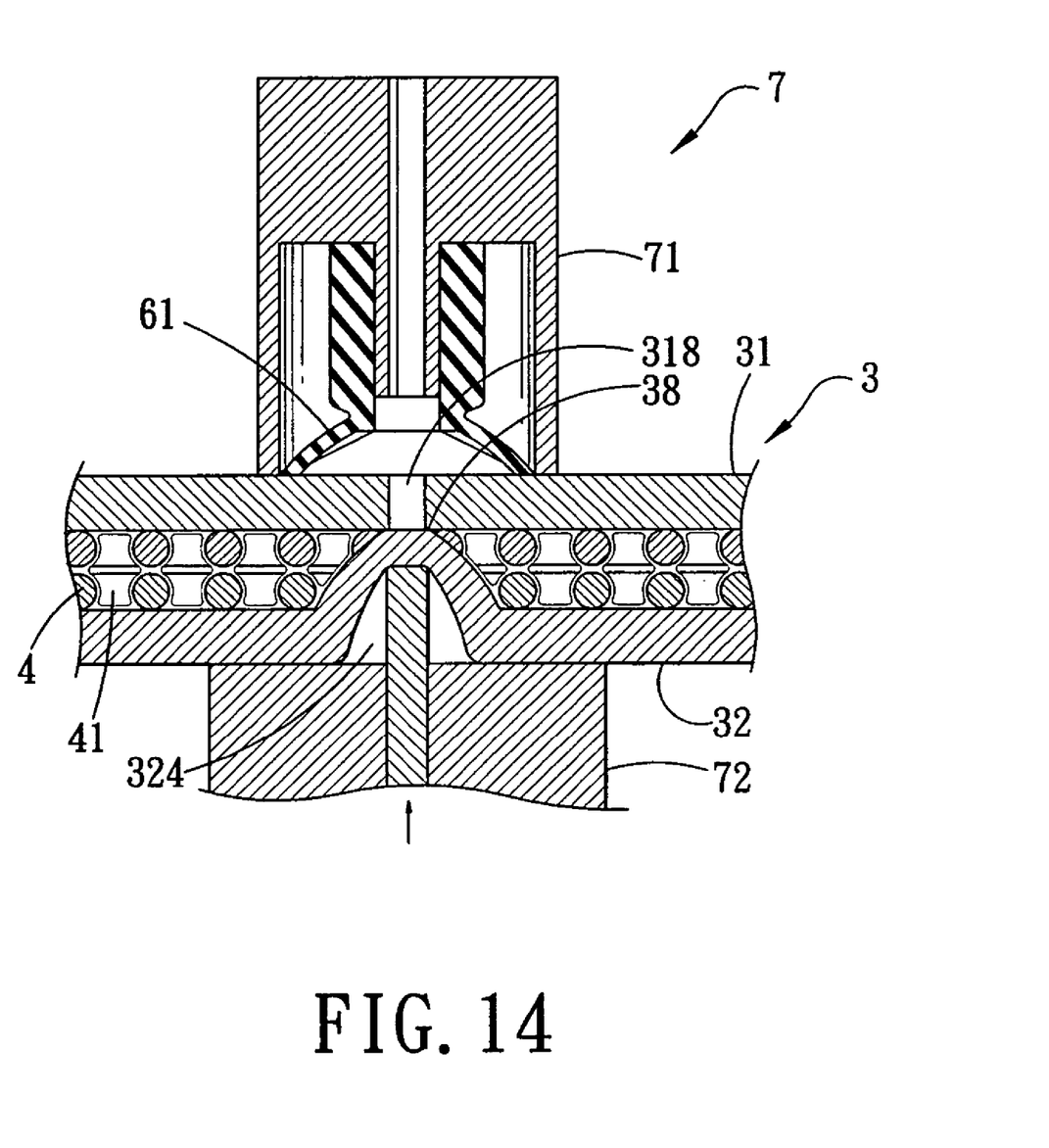
FIG. 14 is a fragmentary sectional view to illustrate how the assembly of the elastically deformable member and the depressing device of the manufacturing system of the preferred embodiment is operated to form a sealing mechanism having a structure different from those shown in FIGS. 11 and 13.

FIG. 14 illustrates how the heat dissipating device is formed with yet another sealing mechanism 38 having a structure different from those of the sealing mechanisms 38 of the heat dissipating devices of FIGS. 11 and 13. The sealing mechanism 38 is formed by depressing solely the lower wall 32 toward the upper wall 31 through driving of the lower pressing member 72 by the lower plunger 732 (see FIG. 6) so as to form a depression 324 in the lower wall 32.

With the inclusion of the elastically deformable member 6 and the depressing device 7 in the manufacturing system of this invention to connect the vacuuming device 69 with the container body 3 for drawing air from the inner space 30 in the container body 3, the aforesaid drawbacks of the prior art can be eliminated.

While the present invention has been described in connection with what is considered the most practical and preferred embodiment, it is understood that this invention is not limited to the disclosed embodiment but is intended to cover various arrangements included within the spirit and scope of the broadest interpretations and equivalent arrangements.

We claim:

1. A manufacturing system for processing a container body into a heat dissipating device, the container body defining an inner space therein, including opposite flat upper and lower walls, and being provided with a wick structure that is disposed between the upper and lower walls, the upper wall being formed with an opening in fluid communication with the inner space, said manufacturing system comprising:

a support adapted to support the container body thereon;

an elastically deformable member that is adapted to cover a periphery of the opening in the upper wall of the container body and that defines a cavity in fluid communication with the inner space through the opening;

a vacuuming device connected to said elastically deformable member and adapted to vacuum the inner space by withdrawing air from the inner space through said cavity and the opening;

a working fluid-loading device connected to said elastically deformable member and adapted to fill a predetermined amount of the working fluid into the container body through said cavity and the opening;

a depressing device including opposite upper and lower pressing members that are adapted to abut respectively against the upper and lower walls of the container body; and a driving mechanism connected to said upper and lower pressing members for driving movement of at least one of said upper and lower pressing members to depress a respective one of the upper and lower walls;

wherein said elastically deformable member has a funnel-shaped part that is adapted to be attached to the container body for covering the opening, and a hollow connecting part that extends from said funnel-shaped part and that is connected to said vacuuming device; and wherein said upper pressing member has an annular outer part that is adapted to abut against the upper wall of the container body and that defines an accommodating space therein, and an inner tube that is surrounded by said annular outer part and that defines a fluid channel therein for fluid communication with said cavity, said elastically deformable member being mounted in said accommodating space in such a manner that said connecting part is securely sleeved on said inner tube and that said funnel-shaped part diverges downwardly from said inner tube to cover the periphery of the opening in the container body.

2. The manufacturing system of claim 1, wherein said elastically deformable member is made from a material selected from silicone and rubbers.

3. The manufacturing system of claim 1, wherein said lower pressing member is in the form of a cylindrical body that is registered with said upper pressing member in a vertical direction transverse to said support, said support being formed with a through-hole, said cylindrical body extending through said through-hole in said support so as to abut against the lower wall.

4. The manufacturing system of claim 3, wherein said driving mechanism includes upper and lower plungers for driving independently movements of said upper and lower pressing members, respectively.

5. The manufacturing system of claim 1, further comprising a heating mechanism mounted on said support, formed with a heating channel connected to said working fluid-loading device and said inner tube, and operable to provide heat to said heating channel so as to vaporize the working fluid in said heating channel during loading of the working fluid into the inner space.

6. The manufacturing system of claim 5, wherein said heating channel is tortuous.

7. The manufacturing system of claim 5, wherein said heating mechanism is further formed with a vacuum-connecting channel that is connected to said vacuuming device and said heating channel.

8. The manufacturing system of claim 5, wherein said heating mechanism is further formed with a fluid-connecting channel that is connected to said working fluid-loading device and said heating channel.

9. The manufacturing system of claim 5, wherein said working fluid-loading device includes a fluid storage container adapted to store the working fluid therein, and a piston-and-cylinder assembly disposed downstream of said fluid storage container and having a cylinder and a piston that extends into said cylinder and that is movable relative to said cylinder so as to draw the predetermined amount of the working fluid from said fluid storage container into said cylinder and so as to deliver the predetermined amount of the working fluid into said heating channel through said fluid connecting channel.

10. The manufacturing system of claim 9, wherein said working fluid-loading device further includes a first control valve disposed between and connected to said fluid storage container and said piston-and-cylinder assembly, and a second control valve disposed between and connected to said piston-and-cylinder assembly and said fluid connecting channel.

11. The manufacturing system of claim 10, wherein said working fluid-loading device further includes a sensor mounted on said piston for detecting the position of said piston relative to said cylinder so as to control the amount of the working fluid to be transferred from said fluid storage container into said cylinder.

* * * * *